United States Patent
Shih et al.

[11] Patent Number: 6,103,567
[45] Date of Patent: Aug. 15, 2000

[54] METHOD OF FABRICATING DIELECTRIC LAYER

[75] Inventors: Wong-Cheng Shih, Hsinchu; Guan-Jye Peng, Taoyuan Hsien; Lan-Lin Chao, Taipei, all of Taiwan

[73] Assignee: Vanguard International Semiconductor Corp., Hsinchu, Taiwan

[21] Appl. No.: 09/371,646

[22] Filed: Aug. 10, 1999

[51] Int. Cl.⁷ .......... H01L 21/336; H01L 21/31; H01G 4/06
[52] U.S. Cl. .......... 438/251; 438/239; 438/240; 438/287; 438/775; 438/785
[58] Field of Search .................. 438/240, 287, 438/775, 785, 239, 251

[56] References Cited

U.S. PATENT DOCUMENTS

| | | | |
|---|---|---|---|
| 5,907,470 | 5/1999 | Kita et al. | 361/311 |
| 5,985,730 | 11/1999 | Lim | 438/393 |
| 6,027,977 | 2/2000 | Mogami | 438/287 |

*Primary Examiner*—Charles Bowers
*Assistant Examiner*—Lisa Kilday
*Attorney, Agent, or Firm*—J.C. Patents; Jiawei Huang

[57] ABSTRACT

A method of fabricating a dielectric layer which is application to be used in a capacitor. A first conductive layer is provided. A nitridation step is performed on the first conductive layer, so that a nitride layer is formed on a surface of the first conductive layer. A dielectric layer with a high dielectric constant is formed, followed by a thermal treatment and an oxygen plasma treatment to terminate dangling bonds of the dielectric layer. Consequently, oxygen is distributed on a surface of the dielectric layer and bonded with dangling bonds of the dielectric layer distributed on the surface.

21 Claims, 6 Drawing Sheets

METHOD OF FABRICATING DIELECTRIC LAYER

BACKGROUND OF THE INVENTION

1. Field of the Invention

The invention relates in general to a method of fabricating a dielectric layer. More particularly, this invention relates to a method of fabricating a capacitor with a high capacitance.

2. Description of the Related Art

The current trend of memory fabrication process for an integrated circuit includes increasing the storage density and the data storage amount on a single chip. A higher density provides a memory with a more compact storage. In addition, to store data into a single chip is more economic compared to store the equivalent amount of data to multiple chips. The density of integrated circuit can be increased via shrinkage of structures, for example, conductive lines or transistor gate, and reduction of spaces between structures. In the fabrication of integrated circuit, the shrinkage of circuit structure can be treated as a reduction of design rule.

The reduction of design rule results in a reduced substrate surface area, and consequently, the available area for fabricating the storage capacitor of a dynamic random access memory (DRAM) is restricted. This limits the storage capacitance of the DRAM. The limitation on storage capacitance leads various problems such as mechanical deterioration and leakage current or even potential loss caused by larger dielectric susceptibility. Furthermore, the loss of storage charges caused by larger dielectric susceptibility may result in a more frequent refresh cycles. While refreshing, the data accesses such as read and write operations can not be processed. Thus, a frequent refresh cycle requires a more complex data access scheme or a more sensitive charge sense amplifier. To increase the capacitance of a capacitor and to resolve the problems mentioned above, a three-dimensional capacitor has been developed. However, considering a high yield and a high throughput, the kind of capacitor structure is complex and difficult to fabricate.

In addition to a three-dimensional capacitor, methods including minimize the thickness of the dielectric layer and using a dielectric layer with high dielectric constant may also achieve the objective of increasing capacitance. However, the method of fabricating a thin dielectric layer is still under developed due to the consideration of uniformity and reliability. In contrast, many approaches have been made for the application of using a dielectric layer with a high dielectric constant. For example, tantalum oxide ($Ta_2O_5$) with a dielectric constant three times larger than silicon nitride has been widely applied. One major problem in employing tantalum oxide is the very significant leakage current. To solve such problem, methods have been disclosed, for example, in U.S. Pat. Nos. 5,444,006, 5,508,221, and U.S. Pat. No. 5,786,248. In these prior art, attention has been drawn upon the leakage current induced by a mutual interaction between the tantalum oxide layer and a bottom electrode. Therefore, an oxide layer or a nitride layer is formed to block the mutual interaction, so as to mitigate the occurrence of leakage current. It is known that the dielectric layer is formed as a thin film between the bottom electrode and the top electrode. Therefore, apart from the mutual interaction to the bottom electrode, the dielectric layer also has a mutual interaction with the top electrode. Therefore, the reduction in leakage current using the conventional method is limited. For the semiconductor devices fabricated with a higher and higher precision by more and more advanced technique, this limit amount can hardly cope with the requirements.

SUMMARY OF THE INVENTION

The invention provides a method of fabricating a dielectric layer. A conductive layer is provided. A nitridation step is performed on the conductive layer. A dielectric layer with a high dielectric constant is formed, and a thermal treatment and a plasma treatment or an ultra violet ozone treatment is performed on the dielectric layer. Therefore, the dangling bonds in and on the dielectric layer can be terminated. In addition, by terminating the dangling bonds on the dielectric layer, oxygen is distributed on a surface of the dielectric layer. As a result, before the formation of the top electrode, a very thin oxy-nitride layer is formed on the dielectric layer with a thickness dependent on the amount of the oxygen provided in the plasma.

A thin nitride layer is formed in the nitridation step performed on the bottom electrode to provide a barrier effect. The mutual interaction between the conductive layer and the dielectric layer is thus blocked. The leakage current occurring between these two layers can thus be suppressed.

While performing the thermal treatment, a crystallization step can also be performed simultaneously. The crystalline structure has a higher dielectric constant to advantage an increase of storage capacitance. However, grain boundary is inherently existent in a crystalline structure to lead another path for current leakage. Therefore, whether the crystallization step is performed is determined by the required specification of the capacitor to be fabricated. In addition, a higher temperature is required for crystallization, the thermal budget may not be achieved.

The plasma treatment includes direct plasma treatment, remote plasma treatment, and downstream treatment. The major difference among these treatments is the way of introducing plasma. At the beginning of the plasma treatment or ultra violet ozone treatment, an oxy-nitride layer is formed as a barrier for the reaction between the gas source used for forming another conductive layer and the dielectric layer. The dielectric layer is thus protected from being deteriorated.

The invention further provides a method of forming a capacitor. A bottom electrode is provided. A nitridation step is performed on the bottom electrode. A dielectric layer is formed on the bottom electrode followed by a thermal treatment to rearrange the atomic structure of the dielectric layer. A plasma treatment or an ultraviolet ozone treatment is performed on the dielectric layer, and a top electrode is formed.

In the invention, a dielectric layer with a high dielectric constant is in use to obtain a high storage capacitance. With the performance of nitirdation, thermal treatment and the plasma or ultra-violet treatment, the dielectric properties of the dielectric is well maintained to result in a high reliability.

Both the foregoing general description and the following detailed description are exemplary and explanatory only and are not restrictive of the invention, as claimed.

DESCRIPTION OF THE PREFERRED EMBODIMENTS

The invention provides a method of fabricating a dielectric layer which can be applied as a capacitor dielectric layer in a capacitor. The fabrication process can be referred to FIG. 1 and FIG. 2A to FIG. 2D.

Figure 1:
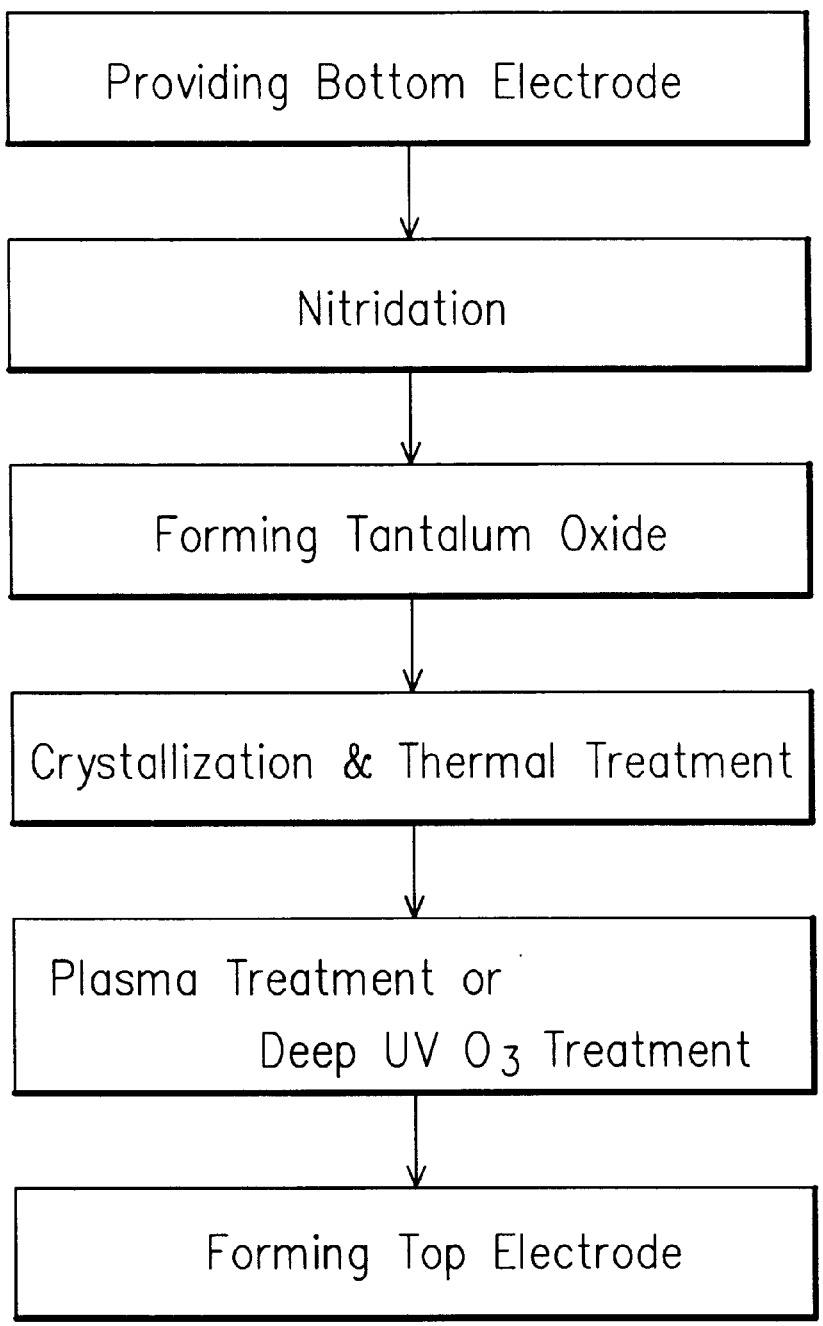
FIG. 1 shows a process flow for fabricating a capacitor according to an embodiment of the invention.
Figure 2A:
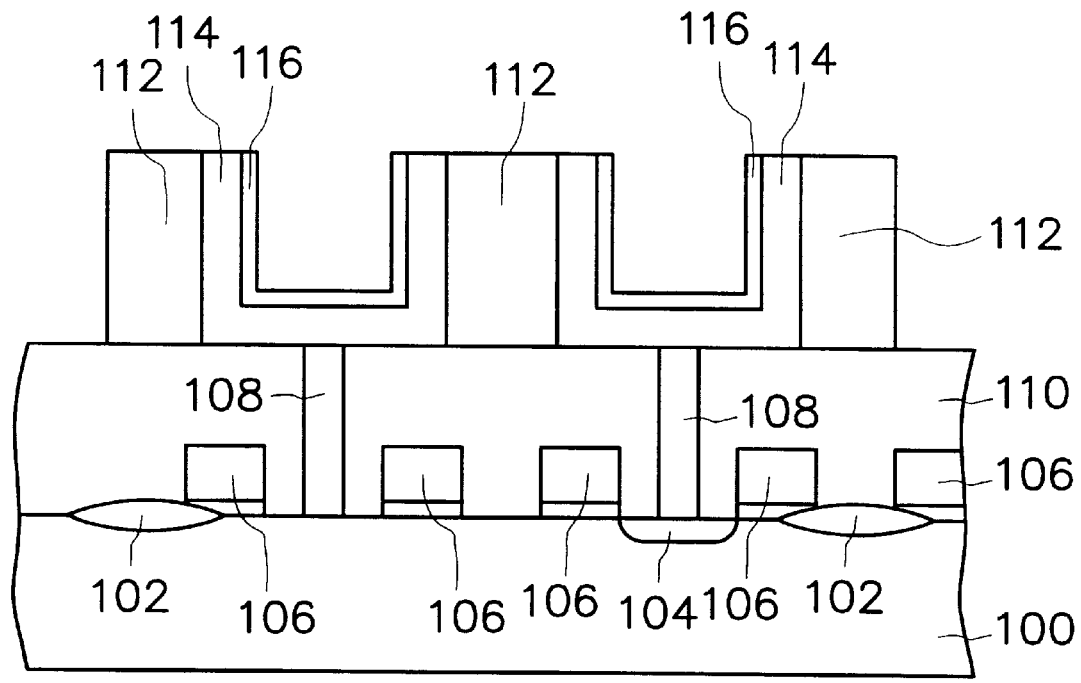
FIG. 2A to FIG. 2D are cross sectional views illustrating the process steps of fabricating a capacitor according to an embodiment of the invention.

Referring to both FIG. 1 and FIG. 2A, a conductive layer 114 is provided. When this conductive layer 114 is applied as a bottom electrode over a substrate 110, the conductive layer 114 can be electrically connected with the substrate 110, for example, a drain region 104 of a metal oxide semiconductor, via a conductive plug 108. For example, the drain region 104 of the metal oxide semiconductor (MOS) is covered by an insulation layer 112, while the conductive plug 108 penetrate through the dielectric layer 112 to couple to the drain region 104. The substrate 100 further comprises an isolation structure 102 such as a field oxide layer, and a conductive line or a gate 106 and an unshown source region of the MOS. The insulation layer 112 is formed to avoid any unwanted connection between conductive portions of the substrate 100 and the neighboring bottom electrodes 114. The material of the bottom electrode 114 includes polysilicon. As shown as the second step of FIG. 1, a nitridation step is performed on the conductive layer 114. A nitride layer 116 as thin as about 10–20 angstrom is formed on the conductive layer 114. While polysilicon is used to form the conductive layer 114, the nitride layer 116 includes a silicon nitride layer ($Si_3N_4$). Other insulation thin layers such as an oxide layer can be used to replace the nitride layer. The formation of this nitride layer blocks a mutual interaction between the conductive layer 114 and a dielectric layer to be formed thereon subsequently. However, forming an insulation layer 116 from a material with a low dielectric constant degrades the dielectric properties of the dielectric layer. Therefore, nitride layer is preferred to oxide layer in most of the time unless consideration over other characteristics is dominant over the consideration of dielectric properties.

Figure 2B:
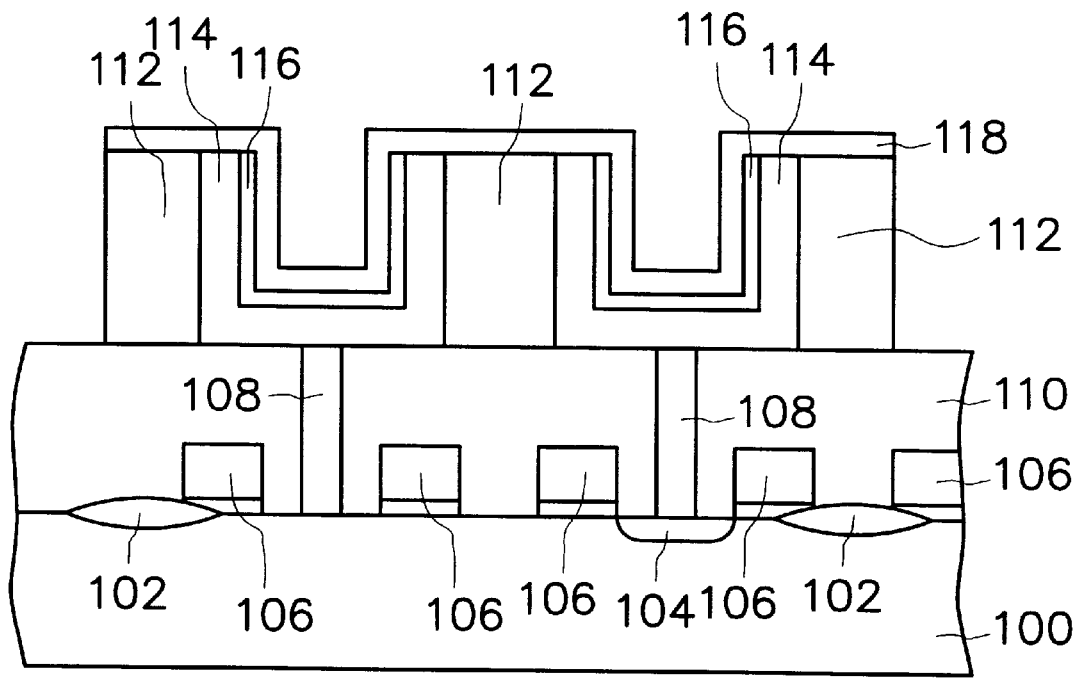

Referring to both FIG. 1 and FIG. 2B, a dielectric layer 118 with a high dielectric constant is formed on the conductive layer 114 including the nitride layer 116. For example, a tantalum oxide layer with a dielectric constant between 22 to 25 is formed by a chemical vapor deposition (CVD) step. In the prior technique, tantalum oxide layer is formed directly on the bottom electrode 114 to cause a mutual interaction to form a silicon oxide layer which degrades the product characteristics. In the high integration semiconductor devices, especially as the fabrication technique approaches to deep submicron stage, the thickness of the dielectric layer 118 itself is substantially very thin. If the dielectric layer 118 is further consumed for the interaction with the bottom 114, the dielectric properties are seriously deteriorated. In addition, since silicon oxide has a relative low dielectric constant, the capacitance is to be seriously reduced. In the invention, a nitridation step is performed before the formation of the dielectric layer, so that the nitride layer 116 is formed. The nitride layer has a dielectric constant higher than that of the oxide layer, yet, it is still only one-third of tantalum oxide. Therefore, is a trade off between effectively blocking the mutual interaction and maintaining the overall dielectric constant for dielectric layer. In this invention, a preferable thickness of the nitride layer 116 is between about 10 angstrom to about 20 angstrom.

Figure 2C:
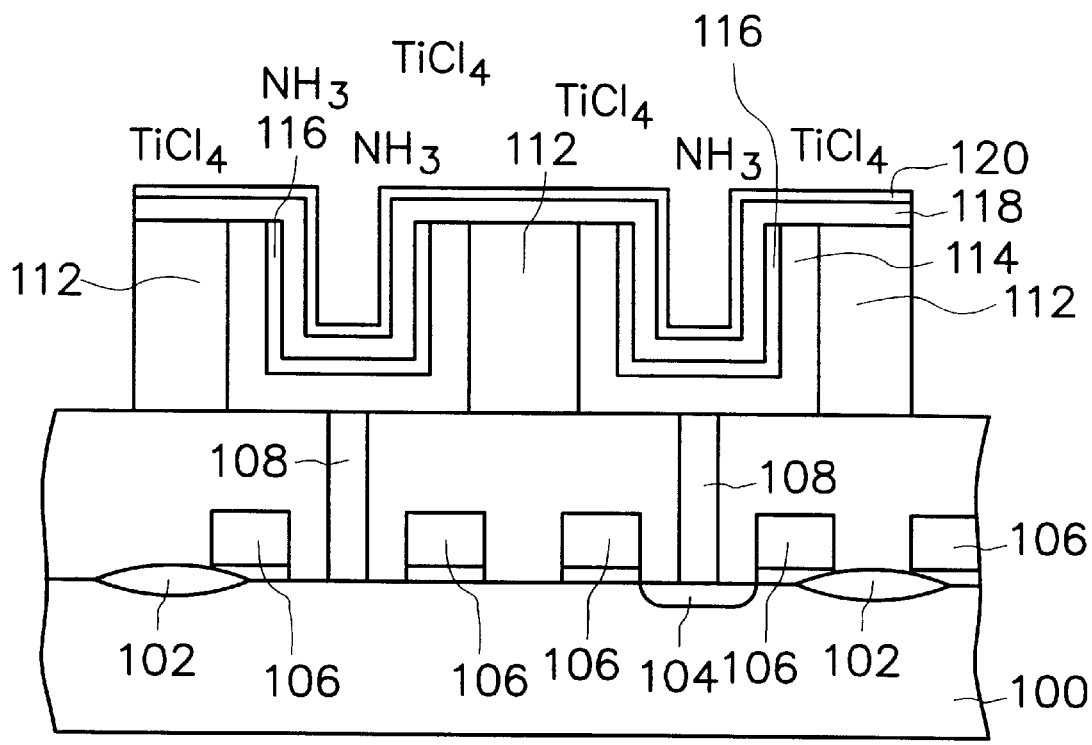

Referring to both FIG. 1 and FIG. 2C, in the fourth step of FIG. 1, a crystallization step and a thermal treatment, for example, an annealing step, are performed. The performance of the annealing step rearranges the structure of the dielectric layer 118 for an improved dielectric property. The crystalline structure typically has a higher dielectric constant than the amorphous structure. Therefore, the capacitance can be increased by crystallization. However, an inherently feature of the to crystalline structure is the formation of a grain boundary which leads a further path for leakage current. In addition, a temperature required to achieve crystallization is about 700 degree Celsius which can hardly meet the thermal budget. Thus, whether the crystallization step is to be performed or in what crystalline level the dielectric layer is required is determined by a specific requirement of the products.

Figure 2D:
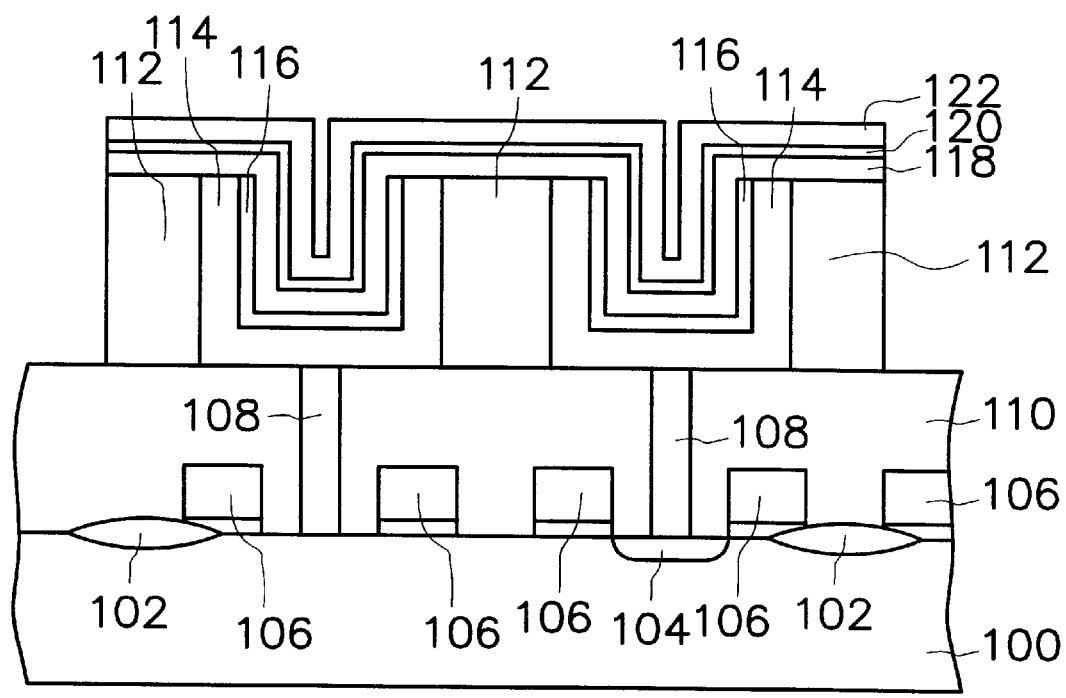
Figure 3:
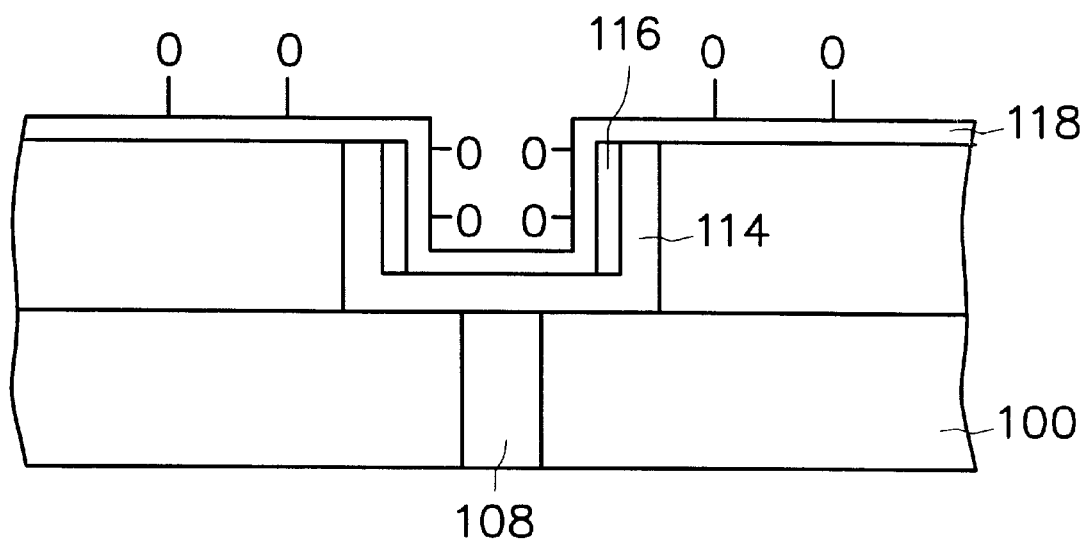
FIG. 3 illustrates a surface structure of a dielectric layer after a plasma treatment or an ultra violet ozone treatment.

Referring to both FIG. 1 and FIG. 2D, the fifth step is performed. That is, an oxygen plasma treatment or a deep ultra-violet ozone treatment is performed. The plasma treatment includes direct plasma treatment, remote plasma treatment and downstream plasma treatment. The major difference among these plasma treatments includes the way of introducing plasma. Taking the remote plasma treatment as an example, the conditions include providing an oxygen plasma with a flow rate between about 1–10 seem, an operation temperature of about 450–800 degree Celsius, an operation pressure of about 1–5 torr and a power of about 2000–4000 Watt for about 15–900 seconds. Thus, the dangling bonds within the dielectric layer 118, that is, the tantalum oxide layer in this example, are terminated by oxygen, including an interior part and a surface part of the dielectric layer 118. As a result, oxygen is distributed on the surface part of the dielectric layer 118 as shown in FIG. 3.

The plasma treatment can be substituted by a deep ultra violet ozone treatment. The objective is similar to that of the plasma treatment. Active oxygen is to be provided to terminate the dangling bonds of the dielectric layer 118. Using ultra-violet to illuminate ozone, the temperature is not to be as high as the plasma treatment for decomposing an ozone molecule into an oxygen molecule and an oxygen atom. The oxygen atom is chemically active to provide an oxidation for the dielectric layer 118. As a consequence, the stability of the dielectric layer is enhanced and oxygen is distributed on the surface part.

Referring to FIG. 1 and FIG. 2D, a conductive layer 122 is formed on the dielectric layer 118. In this embodiment, this conductive layer 122 is a top electrode made of titanium nitride by chemical vapor deposition with ammonia ($NH_3$) and titanium chloride ($TiCl_4$) as gas sources. At the beginning for forming the conductive layer 122, the gas sources are reacted with the oxygen distributed on the surface part of the dielectric layer, so that an oxy-nitride layer 120 is formed. When the conductive layer 122 is made of titanium nitride, the oxy-nitride layer includes an titanium oxynitride layer. Preferably, the thickness is about 10 angstroms in this embodiment. The thickness of the oxy-nitride layer 120 depends on the oxygen content on the surface part of the dielectric layer 118. When the oxygen is completed consumed, the thickness stops increasing any further. Therefore, the invention does not have to worry or consider a way to control the thickness of the oxy-nitride layer since the thickness will only reach a certain value without further growing while the oxygen on the surface part is fully consumed. Thus, the problems induced by a over-thick oxy-nitride layer do not occur. After the formation of the oxy-nitride layer 120, the conductive layer 122 is then deposited on the oxy-nitride layer 120.

While forming the conductive layer 122, if the dielectric layer 118 is directly exposed in the gas sources for forming the conductive layer 122, the dielectric layer 118 may directly react with the gas sources, so that the dielectric quality is degraded to increase the leakage current. In the invention, by the plasma treatment or the ultraviolet ozone treatment, oxygen is distributed on the surface part of the dielectric layer 118 to be reacted into an oxy-nitride layer 120 as a protection or barrier layer on the dielectric layer 118. The oxy-nitride layer 120 thus provides the protection and barrier between the dielectric layer and the gas sources. Moreover, when the conductive layer 122 is formed, the mutual interaction between the conductive layer 122 and the dielectric layer 180 is also blocked by the formation of the oxy-nitride layer.

Figure 4:
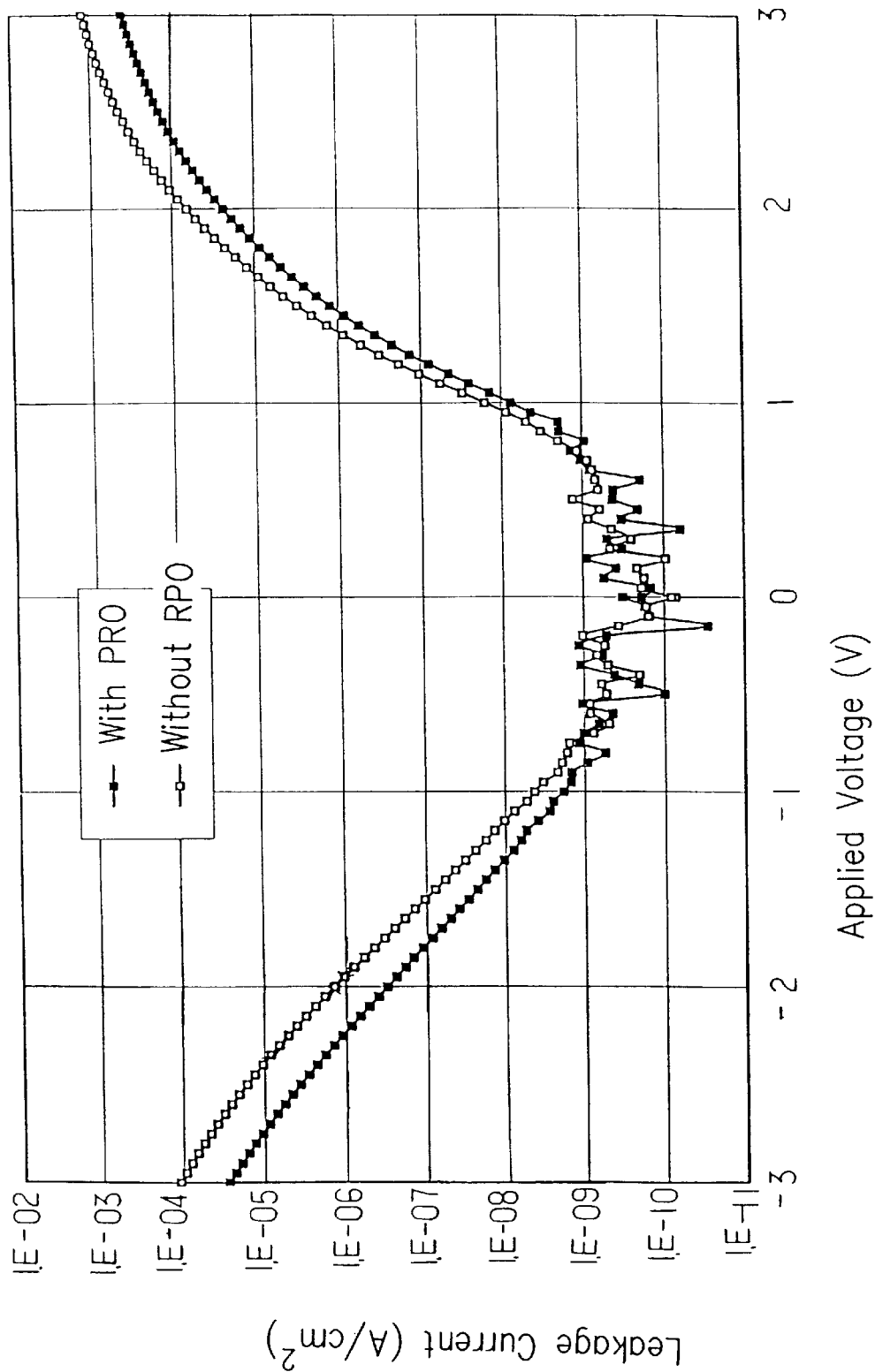
FIG. 4 is a graph drawing the relationship between the leakage current and the applied bias of a capacitor with a top electrode formed at a temperature of 530 degree Celsius.
Figure 5:
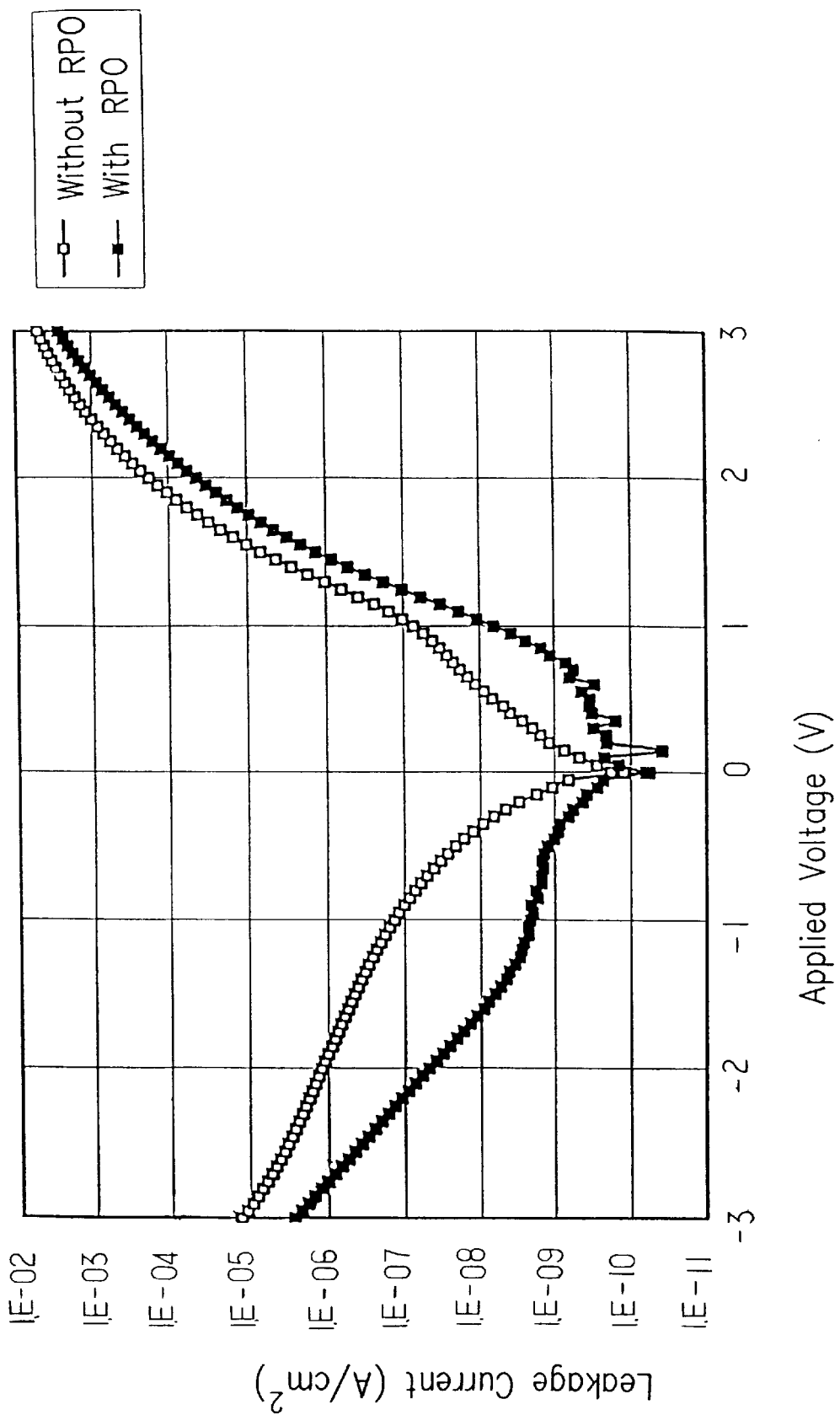
FIG. 5 is a graph drawing the relationship between the leakage current and the applied bias of a capacitor with a top electrode formed at a temperature of 580 degree Celsius.

Using titanium nitride as an example for forming the top electrode, the operation temperature is typically ranged between about 500–700 degrees Celsius, preferably between about 580–680 degrees Celsius. FIG. 4 shows curves of relationship between the leakage current and applied bias. In this example, the top electrode is formed at a temperature of 530 degrees Celsius. As shown from the figure, while the applied bias is +1V, the capacitor being performed with a remote plasma oxidation treatment (RPO) has a leakage current of about 0.79E–8 amperes per square centimeter (A/cm$^{-2}$), while the capacitor without RPO has the leakage current about 1.79E–8 amperes per square centimeter. When the applied bias is –1V, the capacitor being performed with a remote plasma oxidation treatment (RPO) has a leakage current of about 0.21 E–8 amperes per square centimeter (A/cm$^{-2}$), while the capacitor without RPO has the leakage current about 0.42E–8 amperes per square centimeter. FIG. 5 shows the graph illustrating the relationship between leakage current and applied voltage while the operation temperature is 580 degrees Celsius for fabricating the top electrode. while the applied bias is +1V, the capacitor being performed with a remote plasma oxidation treatment (RPO) has a leakage current of about 0.87E–8 amperes per square centimeter (A/cm$^{-2}$), while the capacitor without RPO has the leakage current about 44.86E–8 amperes per square centimeter. When the applied bias is –1V, the capacitor being performed with a remote plasma oxidation treatment (RPO) has a leakage current of about 0.24E–8 amperes per square centimeter (A/cm$^{-2}$), while the capacitor without RPO has the leakage current about 125.52E–8 amperes per square centimeter.

From the above description, the invention provides a method of fabricating a dielectric layer applicable to be used in a capacitor of a DRAM has an increased storage capacitance with increasing leakage current.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a dielectric layer applicable to be used in a capacitor, comprising:
   providing a first conductive layer;
   performing a nitridation step;
   forming a dielectric layer; and
   performing an oxygen plasma treatment to terminate dangling bonds in an interior part and on a surface part of the dielectric layer, so that oxygen is distributed on the surface part.

2. The method according to claim 1, wherein the first conductive layer comprises a bottom electrode.

3. The method according to claim 1, wherein the first conductive layer comprises a polysilicon layer.

4. The method according to claim 3, wherein a silicon nitride layer is formed during the nitridation step.

5. The method according to claim 4, wherein the silicon nitride layer has a thickness of about 10–20 angstroms.

6. The method according to claim 1, wherein a nitride layer is formed on the first conductive layer during the nitridation step.

7. The method according to claim 1, wherein the dielectric layer comprises a tantalum oxide layer.

8. The method according to claim 1, wherein the oxygen plasma treatment is selected from one of a direct oxygen plasma treatment, a remote oxygen plasma treatment, or a downstream oxygen treatment.

9. The method according to claim 8 wherein the remote oxygen plasma treatment is performed under the conditions comprising:
   an oxygen plasma with a flow rate of about 1–10 sccm;
   an operation temperature of about 450–800 degrees Celsius;
   an operation pressure of about 1–5 torrs;
   a power of about 2000–4000 Watt; and
   an operation duration for about 15–900 seconds.

10. The method according to claim 1, wherein oxygen plasma treatment can be replaced with a deep ultra-violet ozone treatment.

11. The method according to claim 1, further comprising forming a second conductive layer after the oxygen plasma treatment.

12. The method according to claim 11, wherein the second conductive layer is a top electrode.

13. The method according to claim 11, wherein the second conductive layer comprises a titanium nitride layer.

14. The method according to claim 13, wherein the titanium nitride layer is formed between a temperature of about 500–700 degree Celsius.

15. The method according to claim 11, wherein the second conductive layer is formed using ammonia and titanium chloride as gas sources.

16. The method according to claim 15, wherein a titanium oxy-nitride layer is formed at a beginning of the step for forming the second conductive layer.

17. The method according to claim 16, wherein the titanium oxy-nitride layer has a thickness of about 10 angstroms.

18. The method according to claim 11, wherein at a beginning of the step for forming the second conductive layer, gas sources used for forming the second conductive layer are reacted with the oxygen distributed on the surface part of the dielectric layer to form a barrier layer.

19. The method according to claim 1, further comprises a thermal step after forming the dielectric layer.

20. The method according to claim 19, wherein the thermal treatment includes thermal annealing step.

21. The method according to claim 1 further comprises a step of crystallization after forming the dielectric layer.

* * * * *